(12) United States Patent
Chen et al.

(10) Patent No.: US 12,457,820 B2
(45) Date of Patent: Oct. 28, 2025

(54) SOLAR CELL, METHOD FOR MANUFACTURING THE SAME, PHOTOVOLTAIC DEVICE, AND PHOTOVOLTAIC SYSTEM

(71) Applicant: TRINA SOLAR CO., LTD., Changzhou (CN)

(72) Inventors: Hong Chen, Changzhou (CN); Yifeng Chen, Changzhou (CN); Di Liu, Changzhou (CN); Wenxing Du, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/383,154

(22) Filed: Oct. 24, 2023

(65) Prior Publication Data

US 2024/0055540 A1 Feb. 15, 2024

(30) Foreign Application Priority Data

Jun. 2, 2023 (CN) .......................... 202310644865.0

(51) Int. Cl.
*H10F 77/20* (2025.01)
*H10F 71/00* (2025.01)
(Continued)

(52) U.S. Cl.
CPC ......... *H10F 77/211* (2025.01); *H10F 71/129* (2025.01); *H10F 77/334* (2025.01); *H10F 77/707* (2025.01)

(58) Field of Classification Search
CPC ... H01L 31/1868; H10F 71/129; H10F 77/334
See application file for complete search history.

(56) References Cited

U.S. PATENT DOCUMENTS 4,886,555 A * 12/1989 Hackstein ....... H01L 31/022433
257/632
7,468,485 B1 * 12/2008 Swanson ............... H01L 31/182
136/243
(Continued)

FOREIGN PATENT DOCUMENTS

CN 106997914 A 8/2017
CN 107851672 A 3/2018
(Continued)

OTHER PUBLICATIONS

Yu (Year: 2021).*
(Continued)

*Primary Examiner* — Sadie White
(74) *Attorney, Agent, or Firm* — Taft Stettinius & Hollister LLP (57) ABSTRACT

The application provides a solar cell, a manufacturing method, a photovoltaic device and a photovoltaic system. The solar cell includes a substrate, a doped conducting layer, a first passivation layer, an anti-reflection layer, a passivation contact layer, and a second passivation layer. The substrate includes opposite first and second surfaces, and side surfaces between the first and second surfaces. The doped conducting layer and the first passivation layer are sequentially stacked on the first surface. The anti-reflection layer is stacked on the first passivation layer and covers the first surface to cover the first passivation layer. The passivation contact layer is stacked on the second surface. The second passivation layer is stacked on the passivation contact layer and covers the second surface to cover the passivation contact layer. The anti-reflection layer or the second passivation layer covers at least part of at least one side surface of the substrate.

10 Claims, 6 Drawing Sheets

(51) Int. Cl.
*H10F 77/30* (2025.01)
*H10F 77/70* (2025.01)

(56) References Cited

U.S. PATENT DOCUMENTS

| | | | | |
|---|---|---|---|---|
| 2011/0100459 | A1* | 5/2011 | Yoon | H01L 31/02363 257/E31.13 |
| 2011/0162706 | A1* | 7/2011 | Borden | H10F 10/14 257/E31.119 |
| 2012/0000528 | A1* | 1/2012 | Dennis | H01L 31/182 136/258 |
| 2012/0247548 | A1* | 10/2012 | Seo | H01L 31/02167 257/E31.127 |
| 2013/0025665 | A1* | 1/2013 | Lee | H01L 31/022433 257/E31.124 |
| 2013/0118571 | A1* | 5/2013 | Shim | H01L 31/02363 257/E31.124 |
| 2014/0014175 | A1* | 1/2014 | Ito | H01L 31/03682 136/256 |
| 2016/0111319 | A1 | 4/2016 | Voelk et al. | |
| 2016/0155866 | A1* | 6/2016 | Ha | H01L 31/02168 136/255 |
| 2016/0284917 | A1* | 9/2016 | Rim | H01L 31/02363 |
| 2020/0058806 | A1* | 2/2020 | Sperlich | H01L 21/02172 |

FOREIGN PATENT DOCUMENTS

| | | |
|---|---|---|
| CN | 108235787 A | 6/2018 |
| CN | 111509090 A | 8/2020 |
| CN | 114122165 A | 3/2022 |
| CN | 218182221 U | 12/2022 |
| CN | 115810688 A | 3/2023 |
| CN | 115836398 A | 3/2023 |
| EP | 2434548 A2 | 3/2012 |
| EP | 3026713 A1 | 6/2016 |
| EP | 3029738 | 6/2016 |
| EP | 3188258 A1 | 7/2017 |
| JP | 2015050279 A | 3/2015 |
| JP | 2016103642 A | 6/2016 |
| JP | 6664207 B2 | 3/2020 |
| JP | 6795653 B2 | 12/2020 |
| JP | 2024012565 A | 1/2024 |
| KR | 101740524 B1 | 6/2017 |
| KR | 20200090532 A | 7/2020 |
| TW | I639241 B | 10/2018 |
| WO | 2023083418 A1 | 5/2023 |

OTHER PUBLICATIONS

Japanese Office Action for corresponding JP Application No. 2023-191910, dated Dec. 26, 2023, 4 pages.
Decision to Grant for corresponding Application No. 202310644865.0 dated Aug. 3, 2023, 7 pages.
Chinese Office Action for corresponding Application No. 202310644865.0 dated Jul. 10, 2023, 13 pages.
Chinese Office Action for corresponding Application No. 202310644865.0 dated Jul. 24, 2023, 9 pages.
European Patent Office, Extended Search Report issued in corresponding Application No. 23206218.2, dated May 7, 2024, 9 pp.
Japanese Patent Office, Office Action issued in corresponding Application No. 2024-166321, dated Aug. 19, 2025, 8 pp.

* cited by examiner

SOLAR CELL, METHOD FOR MANUFACTURING THE SAME, PHOTOVOLTAIC DEVICE, AND PHOTOVOLTAIC SYSTEM

CROSS-REFERENCE TO RELATED APPLICATION

This application claims priority to Chinese patent application No. 202310644865.0, filed on Jun. 2, 2023, and titled "SOLAR CELL, METHOD FOR MANUFACTURING THE SAME, PHOTOVOLTAIC DEVICE, AND PHOTOVOLTAIC SYSTEM", the content of which is hereby incorporated herein in its entirety by reference.

TECHNICAL FIELD

The present application relates to the technical field of solar cells, in particular to a solar cell and a method for manufacturing the same, a photovoltaic device, and a photovoltaic system.

BACKGROUND

With the rapid development of the technology in photovoltaic industry, the requirement for the high conversion efficiency of solar cells is constantly increasing, and efforts are being put into development and research of high-efficiency solar cells by many industry manufacturers. In recent years, the industry has seen a surge in research related to the surface passivated contact technology, wherein the tunnel oxide passivated contact (TOPCon) technology involves preparation of an ultra-thin tunnel oxide layer and a doped polysilicon layer on the surface of the cell, cooperatively forming the passivation contact structure. The passivation contact structure can greatly reduce the metal contact recombination current and increase the open circuit voltage and the short circuit current of the cell. However, in TOPCon cells of the related art, a large amount of carrier recombination occurs at the edge surface of the cell, resulting in low efficiency of the solar cells.

SUMMARY

In view of the above, the present application provides a solar cell and a method for manufacturing the same, a photovoltaic device, and a photovoltaic system.

The present application provides a solar cell, including:
a substrate, including a first surface, a second surface opposite to the first surface, and a plurality of side surfaces adjacent to and between the first surface and the second surface;
a doped conducting layer and a first passivation layer, sequentially stacked on and only cover the first surface;
an anti-reflection layer, stacked on the first passivation layer, the anti-reflection layer covering the first surface to at least cover the first passivation layer;
a passivation contact layer, stacked on the second surface; and
a second passivation layer, stacked on the passivation contact layer, the second passivation layer covering the second surface to at least cover the passivation contact layer;
wherein the anti-reflection layer further covers at least part of at least one side surface of the substrate, or the second passivation layer further covers at least part of at least one side surface of the substrate.

In some embodiments, as the anti-reflection layer further covers at least part of at least one side surface of the substrate, or the second passivation layer further covers at least part of at least one side surface of the substrate, the at least part of the at least one side surface of the substrate is protected by the anti-reflection film or the second passivation layer, providing passivation to the edge surface of the solar cell corresponding to the side surface, reducing the carrier recombination at the edge surface of the solar cell, and increasing the efficiency of the solar cell.

In some embodiments, the anti-reflection layer covers at least part of each of the plurality of side surfaces, or the second passivation layer covers at least part of each of the plurality of side surfaces.

In some embodiments, the anti-reflection layer at least completely covers the plurality of side surfaces, and at least completely covers surfaces of the passivation contact layer on the same sides as the plurality of side surfaces.

In some embodiments, the anti-reflection layer further covers at least part of the second surface, the at least part of the second surface being adjacent to the plurality of side surfaces; or an edge of the anti-reflection layer adjacent to the second surface is flush with a surface of the passivation contact layer away from the substrate.

In some embodiments, the second passivation layer covers at least part of the anti-reflection layer.

In some embodiments, in directions normal to the plurality of side surfaces of the substrate, the plurality of side surfaces of the substrate are respectively flush with edges of the doped conducting layer, the first passivation layer, and the anti-reflection layer on the same sides as the plurality of side surfaces of the substrate; and
a part of the second passivation layer is disposed on and at least completely covers the plurality of side surfaces of the substrate, and at least completely cover the edges of the doped conducting layer, the first passivation layer, and the anti-reflection layer on the same sides as the plurality of side surfaces.

In some embodiments, the second passivation layer further covers at least part of the first surface, the at least part of the first surface being adjacent to the plurality of side surfaces; or
an edge of the second passivation layer adjacent to the first surface is flush with an outer surface of the anti-reflection layer along the thickness direction of the substrate.

The present application further provides a method for manufacturing a solar cell, including:
providing a panel, the panel including a substrate, a doped conducting layer, a first passivation layer, and a passivation contact layer, the substrate including a first surface, a second surface opposite to the first surface, and a plurality of side surfaces adjacent to and between the first surface and the second surface, the doped conducting layer and the first passivation layer being sequentially stacked on and only cover the first surface, and the passivation contact layer being stacked on the second surface;
forming an anti-reflection layer on the first passivation layer, the anti-reflection layer covering the first surface to at least cover the first passivation layer;
forming a second passivation layer on the passivation contact layer, the second passivation layer covering the second surface to completely cover the passivation contact layer;

wherein the anti-reflection layer or the second passivation layer further covers at least part of at least one side surface of the substrate.

In some embodiments, the step of forming the anti-reflection layer on the first passivation layer includes:

on a condition that the passivation contact layer of the panel faces a positioning boat, clamping the panel by positioning protrusions disposed on the positioning boat, and depositing an anti-reflection material on a first unblocked surface area of the panel; and adjusting a position of the positioning protrusions relative to the plurality of side surfaces of the substrate to form a second unblocked surface area of the panel, and depositing the anti-reflection material on the second unblocked surface area of the panel, thereby forming the anti-reflection layer on the first passivation layer, wherein the anti-reflection layer at least covers the first passivation layer, the plurality of side surfaces, and surfaces of the passivation contact layer on the same sides as the plurality of side surfaces.

In some embodiments, on a condition that the passivation contact layer of the panel is in contact with the positioning boat, an edge of the anti-reflection layer adjacent to the second surface is formed to be flush with a surface of the passivation contact layer away from the substrate;

on a condition that a distance is formed between the passivation contact layer of the panel and the positioning boat, the anti-reflection layer is formed to further cover at least part of the passivation contact layer adjacent to the plurality of side surfaces.

In some embodiments, in directions normal to the plurality of side surfaces of the substrate, the plurality of side surfaces of the substrate are respectively flush with edges of the doped conducting layer, the first passivation layer, and the anti-reflection layer on the same sides as the plurality of side surfaces of the substrate; and a first structure includes the panel and the anti-reflection layer formed on the panel, and the step of forming the second passivation layer on the passivation contact layer includes:

on a condition that the anti-reflection layer faces the positioning boat, clamping the first structure by the positioning protrusions disposed on the positioning boat, and depositing an second passivation material on a first unblocked surface area of the first structure adjusting a position of the positioning protrusions relative to the plurality of side surfaces of the substrate to form a second unblocked surface area of the first structure, and depositing the second passivation material on the second unblocked surface area of the first structure, thereby forming the second passivation layer on the passivation contact layer, wherein the second passivation layer at least completely covers the plurality of side surfaces, and at least completely covers the edges of the doped conducting layer, the first passivation layer, and the anti-reflection layer on the same sides as the plurality of side surfaces.

In some embodiments, on a condition that the anti-reflection layer is in contact with the positioning boat, an edge of the second passivation layer adjacent to the second surface is formed to be flush with an outer surface of the anti-reflection layer along the thickness direction of the substrate;

on a condition that a distance is formed between the anti-reflection layer and the positioning boat, the second passivation layer is formed to further cover at least part of the first surface, the at least part of the first surface being adjacent to the plurality of side surfaces.

In some embodiments, the step of providing the panel includes:

forming the doped conducting layer on the first surface of the substrate;

forming the passivation contact layer on the second surface of the substrate; and forming the first passivation layer on the doped conducting layer.

The present application further provides a photovoltaic device, including at least one cell group, wherein the cell group includes the above-described solar cell.

The present application further provides a photovoltaic system, including the above-described photovoltaic device.

DETAILED DESCRIPTION

In order to make the above objectives, features and advantages of the present application more clear and understandable, embodiments of the present application will be described in detail below with reference to the accompanying drawings. In the following description, many specific details are explained to make the present application fully understandable. However, the present application can be implemented in many other ways different from those described herein, and those skilled in the art can make similar improvements without departing from the connotation of the present application. Therefore, the present application is not limited by the specific embodiments disclosed below.

In addition, the terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly includes at least one of the elements. In the description of the present application, "a plurality of" means at least two, such as two, three, etc., unless otherwise specifically defined.

In the present application, unless otherwise clearly specified and defined, the terms "installed", "connected", "coupled", "fixed" and other terms should be interpreted broadly. For example, an element, when being referred to as being "installed", "connected", "coupled", "fixed" to another element, unless otherwise specifically defined, may be fixedly connected, detachably connected, or integrated to the other element, may be mechanically connected or electrically connected to the other element, and may be directly connected to the other element or connected to the other element via an intermediate element. For those of ordinary skill in the art, the specific meaning of the above-mentioned terms in the present application can be understood according to specific circumstances.

The following describes embodiments of the solar cell, the method for manufacturing the solar cell, the photovoltaic device, and the photovoltaic system with reference to the drawings.

In the related art, there is a problem that the recombination loss at the edge surface of the solar cell is relatively large, resulting in a decrease in the efficiency of the solar cell. In embodiments of the present application, by adjusting the contact position between the substrate and the positioning tool during the manufacturing process, the anti-reflection layer or the second passivation layer is at least deposited on the side surfaces of the substrate, which can reduce the recombination at the edge surface of the solar cell and improve the photoelectric conversion efficiency.

Figure 1:
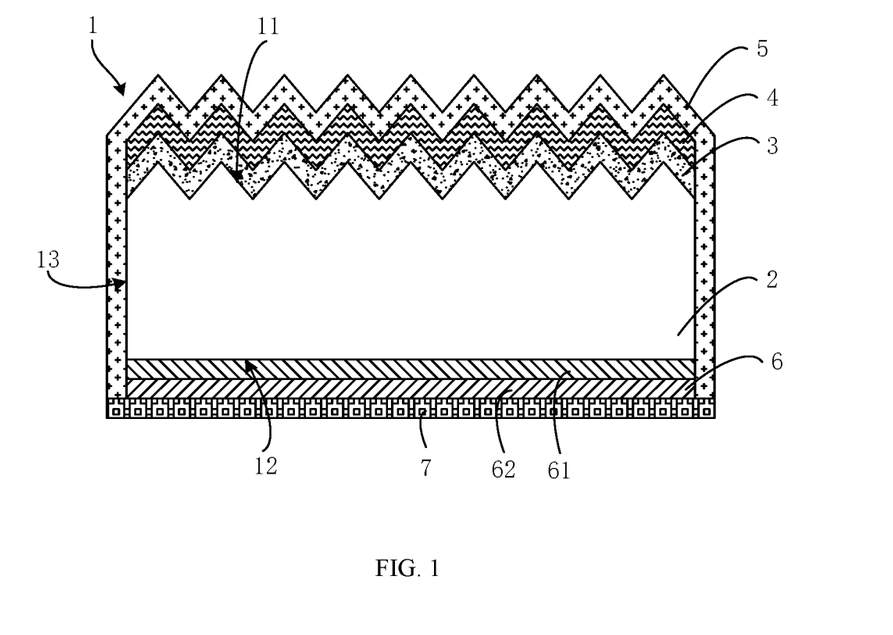
FIG. 1 is a schematic structural view of a solar cell according to an embodiment of the present application.

Referring to FIG. 1, an embodiment of the present application provides a solar cell 1, including a substrate 2, a doped conducting layer 3, a first passivation layer 4, an anti-reflection layer 5, a passivation contact layer 6, and a second passivation layer 7.

The substrate 2 includes a first surface 11, a second surface 12 opposite to the first surface 11, and a plurality of side surfaces 13 adjacent to and between the first surface 11 and the second surface 12. The doped conducting layer 3 and the first passivation layer 4 are sequentially stacked on the first surface 11, and only cover the first surface 11. The anti-reflection layer 5 is stacked on the first passivation layer 4, and the anti-reflection layer 5 covers the first surface 11 to at least cover the first passivation layer 4. The passivation contact layer 6 is stacked on the second surface 12. The second passivation layer 7 is stacked on the passivation contact layer 6, and the second passivation layer 7 covers the second surface 12 to at least cover the passivation contact layer 6. The anti-reflection layer 5 further covers at least part of at least one side surface 13, or the second passivation layer 7 further covers at least part of at least one side surface 13. It should be noted that in the present application, one layer covering another layer can be either the layer being directly formed on the other layer, or the layer being disposed on a third layer which is directly formed on the other layer. The term "cover" is used to define the range a layer extends to.

At least part of at least one side surface 13 of the substrate 2 is protected by the anti-reflection layer 5 or the second passivation layer 7, so that passivation is provided to the edge surface of the solar cell 1 corresponding to the side surface 13, thereby reducing the carrier recombination at the edge surface of the solar cell 1 and increasing the efficiency of the solar cell 1. In some embodiments, the anti-reflection layer 5 covers at least part of each side surface 13, or the second passivation layer 7 covers at least part of each side surface 13.

The doped conducting layer 3 is adapted to form a p-n junction with the substrate 2. The embodiments herein are illustrated with the doped conducting layer 3 being a p-type doped conducting layer 3 (e.g., doped with boron element) as an example. Other embodiments where the doped conducting layer 3 is in the other type are similar to these embodiments and will not be repeatedly described herein.

The first passivation layer 4 functions to provide surface passivation, and can be, for example, an aluminum oxide passivation layer, which is adapted to passivate the dangling bonds of the surface of the substrate 2 relatively well.

The doped conducting layer 3 and the first passivation layer 4 are sequentially stacked on the first surface 11, which means that the doped conducting layer 3 is stacked on the first surface 11, and the first passivation layer 4 is stacked on the doped conducting layer 3 at the side away from the first surface 11. The doped conducting layer 3 and the first passivation layer 4 only cover the first surface 11, which means that the extending ranges of the doped conducting layer 3 and the first passivation layer 4 are limited to the first surface 11, and the doped conducting layer 3 and the first passivation layer 4 do not extend to other surfaces of the substrate 2.

The anti-reflection layer 5 covers the first surface 11, and further covers at least part of at least one side surface 13, for example, further covers at least part of each side surface 13. For example, the anti-reflection layer 5 not only extends to cover the first surface 11, but also extends to each side surface 13, and is directly stacked on the each side surface 13 of the substrate 2. The anti-reflection layer 5 can reduce loss of light energy due to reflection on the surface of the solar cell 1 and improve the conversion efficiency of the cell. The anti-reflection layer 5 can be a single-layer or multi-layer structure, and can be made of, for example, one or more of silicon oxide, silicon nitride, or silicon oxynitride.

In some other embodiments, the second passivation layer 7 covers the second surface 12, and further covers at least part of at least one side surface 13, for example, further covers at least part of each side surface 13. For example, the second passivation layer 7 not only extends to cover the second surface 12, but also extends to each side surface 13, and is directly stacked on the each side surface 13 of the substrate 2. The second passivation layer 7 can be a single-layer or multi-layer structure, and can be made of, for example, one or more of silicon oxide, silicon nitride, or silicon oxynitride. The second passivation layer 7 can additionally include at least one anti-reflection material layer stacked on the passivation contact layer 6. In this way, the reflectivity of the back of the solar cell 1 to sunlight can be reduced, and the absorptivity of the back of the solar cell 1 to sunlight can be increased, so that the second passivation layer 7 can provide both passivation and anti-reflection functions.

As mentioned above, the anti-reflection layer 5 can be directly stacked on each side surface 13 of the substrate 2. As for the extending range of the anti-reflection layer 5 on the side surface 13 of the substrate 2, in order to fully passivate the side surface 13, the anti-reflection layer 5 at least completely covers each side surface 13, and at least completely covers the surface of the passivation contact layer 6 on the same side as the side surface 13, i.e., completely covers the side surface of the passivation contact layer 6 in addition to the side surface 13 of the substrate 2.

In this way, all positions where carrier recombination may occur in the edge surface of the solar cell 1 can be covered, thereby avoiding carrier recombination and current leakage at the edge surface of the solar cell 1 and improving the efficiency of the solar cell 1.

Exemplarily, referring to FIG. 1, in some embodiments, the edge of the anti-reflection layer 5 adjacent to the second surface 12 is flush with the surface of the passivation contact layer 6 away from the substrate 2, i.e., is flush with the outer surface of the passivation contact layer 6 in the thickness direction of the substrate 2.

Figure 2:
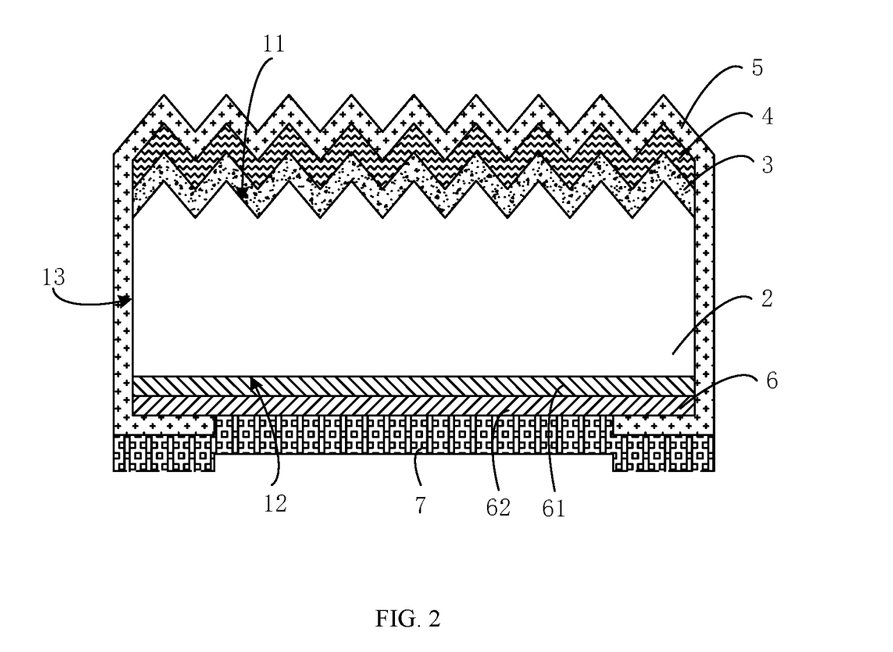
FIG. 2 is a schematic structural view of a solar cell according to another embodiment of the present application.

Alternatively, referring to FIG. 2, the anti-reflection layer 5 further covers at least part of the second surface 12, and the at least part of the second surface 12 is adjacent to the side surface 13. In this way, a part of the anti-reflection layer 5 is stacked on the passivation contact layer 6 to ensure that the entire side surface 13 of the substrate 2 and the entire side surface of the passivation contact layer 6 are protected by the anti-reflection layer 5. It should be understood that in this way a passivation field can also be formed at the peripheral area of the second surface 12, which can effectively reduce the recombination center of the second surface 12 of the substrate 2.

Further, the second passivation layer 7 covers at least part of the anti-reflection layer 5. In the embodiment shown in FIG. 1, the second passivation layer 7 covers the edges of the anti-reflection layer 5 adjacent to the second surface 12. In the embodiment shown in FIG. 2, a part of the second passivation layer 7 is stacked on the anti-reflection layer 5, and thus the thickness of the solar cell 1 in the stacked area of the second passivation layer 7 and the anti-reflection layer 5 will be greater than that at the center of the solar cell 1. The thickness difference can be, for example, in a range from 5 nanometers to 1 micron (including endpoint values of the range). This can ensure that layers can be deposited effectively on the side surface 13 and the peripheral area of the second surface 12 of the substrate 2 to form a passivation field and protect the surfaces of the substrate 2 from carrier recombination.

In some embodiments, in the direction normal to a side surface 13 of the substrate 2, the side surface 13 of the substrate 2 is flush with an edge of the passivation contact layer 6 on the same side as the side surface 13. That is, the extending range of the passivation contact layer 6 is limited to the second surface 12, without extending to the side surface 13 of substrate 2. The passivation contact layer 6 can include a tunnel oxide layer 61 and a doped polysilicon conductive layer 62 sequentially stacked on the second surface 12. The tunneling oxide layer 61 can passivate the second surface 12 of the substrate 2 by chemical passivation. The tunnel oxide layer 61 can be made of a dielectric material, such as silicon oxide or the like.

Figure 3:
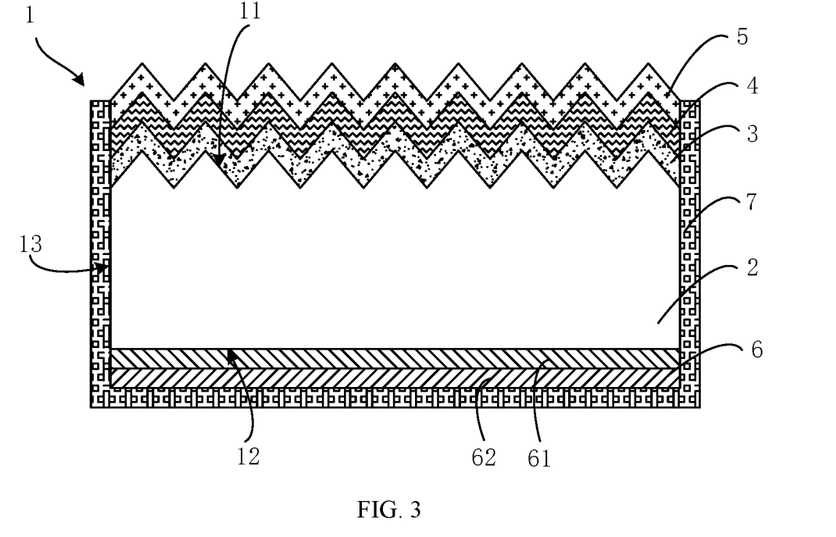
FIG. 3 is a schematic structural view of a solar cell according to another embodiment of the present application.
Figure 4:
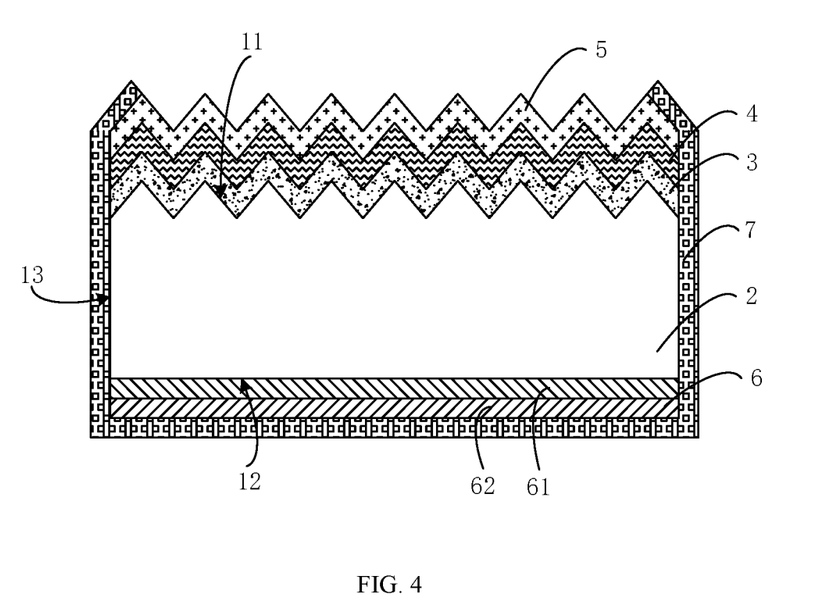
FIG. 4 is a schematic structural view of a solar cell according to another embodiment of the present application.

Further, referring to FIG. 3 and FIG. 4, in the direction normal to a side surface 13 of the substrate 2, the side surface 13 of the substrate 2 is flush with the edges of the doped conducting layer 3, the first passivation layer 4, and the anti-reflection layer 5 on the same side as the side surface 13 of the substrate 2. A part of the second passivation layer 7 is disposed on the side surfaces 13, and at least completely covers the side surfaces 13, and at least completely covers the edges of the doped conducting layer 3, the first passivation layer 4, and the anti-reflection layer 5 on the same side as the side surfaces 13. Exemplarily, the second passivation layer 7 is directly stacked on each side surface 13 to protect each side surface 13, and at least completely cover the edges of the doped conducting layer 3, the first passivation layer 4, and the anti-reflection layer 5 on the same side as each side surface 13 to passivate the edge of the solar cell 1 well.

In a specific embodiment, as shown in FIG. 3, the edge of the second passivation layer 7 adjacent to the first surface 11 of the substrate 2 is flush with the outer surface of the anti-reflection layer 5 along the thickness direction of the substrate 2.

Alternatively, as shown in FIG. 4, the second passivation layer 7 further covers at least part of the first surface 11, the at least part of the first surface 11 being adjacent to the side surface 13. In this way, a part of the second passivation layer 7 is stacked on the peripheral area of the anti-reflection layer 5 on the first surface 11, and thus the thickness of the solar cell 1 in the stacked area of the second passivation layer 7 and the anti-reflection layer 5 will be greater than that at the center of the solar cell 1. The thickness difference can be, for example, in a range from 5 nanometers to 1 micron (including endpoint values of the range). This can ensure that a passivation field can be formed on the peripheral area of the first surface 11 to effectively reduce recombination center on the first surface 11 of the substrate 2. Meanwhile, the layers can be deposited effectively on the side surface 13 and the peripheral area of the first surface 11 of the substrate 2 to form a passivation field and protect the surfaces of the substrate 2 from carrier recombination.

Figure 5:
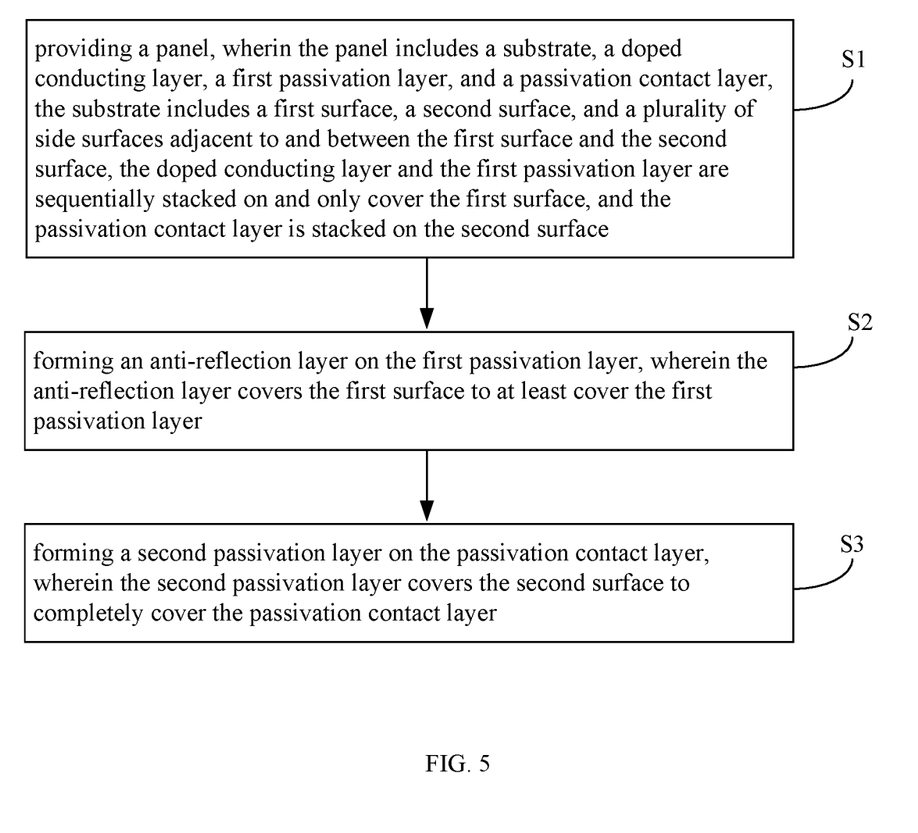
FIG. 5 is a flow chart of a method for manufacturing a solar cell according to an embodiment of the present application.

An embodiment of the present application provides a method for manufacturing a solar cell, including steps S1 to S3.

In step S1, a panel 10 is provided. The panel 10 includes a substrate 2, a doped conducting layer 3, a first passivation layer 4, and a passivation contact layer 6. The substrate 2 includes a first surface 11, a second surface 12 opposite to the first surface 11, and a plurality of side surfaces 13 adjacent to and between the first surface 11 and the second surface 12. The doped conducting layer 3 and the first passivation layer 4 are stacked on the first surface 11 in sequence, and only cover the first surface 11. The passivation contact layer 6 is stacked on the second surface 12;

In step S2, an anti-reflection layer 5 is formed on the first passivation layer 4, and the anti-reflection layer 5 covers the first surface 11 to at least cover the first passivation layer 4.

In step S3, a second passivation layer 7 is formed on the passivation contact layer 6, and the second passivation layer 7 covers the second surface 12 to completely cover the passivation contact layer 6. The anti-reflection layer 5 or the second passivation layer 7 further covers at least part of at least one side surface 13.

At least part of at least one side surface 13 of the substrate 2 is protected by the anti-reflection layer 5 or the second passivation layer 7, so that passivation is provided to the edge surface of the solar cell 1 corresponding to the side surface 13, reducing the carrier recombination at the edge surface of the solar cell 1, and increasing the efficiency of the solar cell 1. In some embodiments, the anti-reflection layer 5 covers at least part of each side surface 13, or the second passivation layer 7 covers at least part of each side surface 13.

Figure 6:
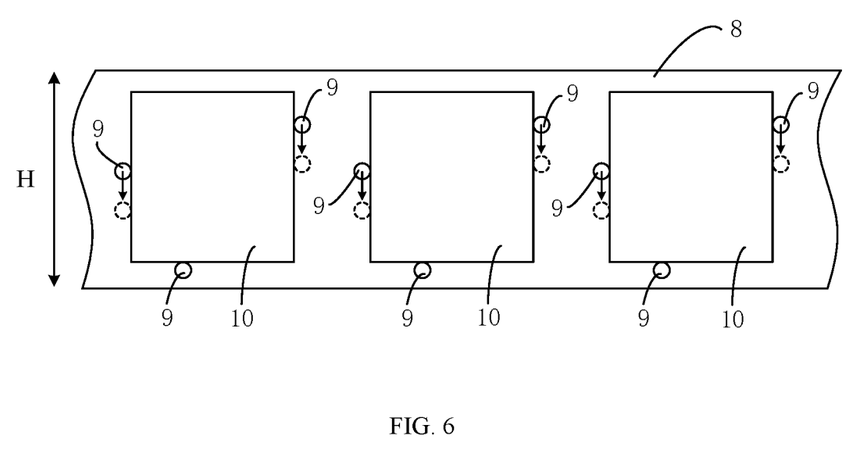
FIG. 6 is a schematic structural view of a positioning tool used in a method for manufacturing a solar cell according to an embodiment of the present application.

In some embodiments, during the manufacturing process of the solar cell 1, a positioning tool is used to position the panel 10. The positioning tool can include a plurality of positioning boats 8 arranged side by side and a plurality of positioning protrusions 9. FIG. 6 shows one of the positioning boats 8, and as shown in FIG. 6, the positioning protrusions 9 are arranged to surround the panel 10, and clamp the panel 10 thereby fixing the panel 10 onto the positioning boat 8. The positioning protrusions 9 are fixed on the positioning boat 8 on the one hand, and on the other hand, the positioning protrusions 9 are also respectively in contact with the side surfaces 13 of the panel 10 and, optionally, in contact with the surface of the panel 10 away from the positioning boat 8, so as to position the panel 10. The positioning tool can be a graphite boat.

Further, in step S3, after the second passivation layer 7 is formed on the passivation contact layer 6, the method further includes a step of forming electrodes respectively on the anti-reflection layer 5 and the second passivation layer 7.

Further, in step S1, the step of providing the panel 10 includes:
  forming the doped conducting layer 3 on the first surface 11 of the substrate 2;
  forming the passivation contact layer 6 on the second surface 12 of the substrate 2; and
  forming the first passivation layer 4 on the doped conducting layer 3.

Figure 7:
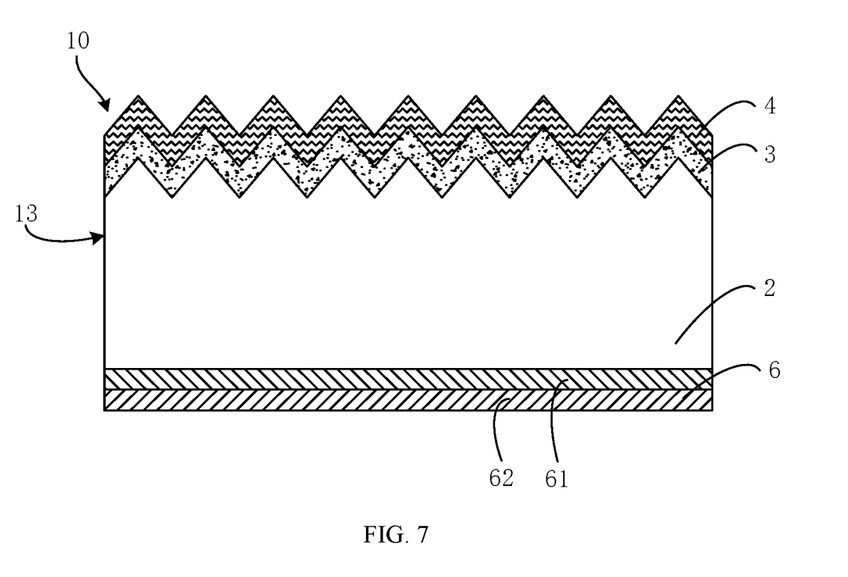
FIG. 7 is a schematic structural view of a panel used in a method for manufacturing a solar cell according to an embodiment of the present application.
Figure 8:
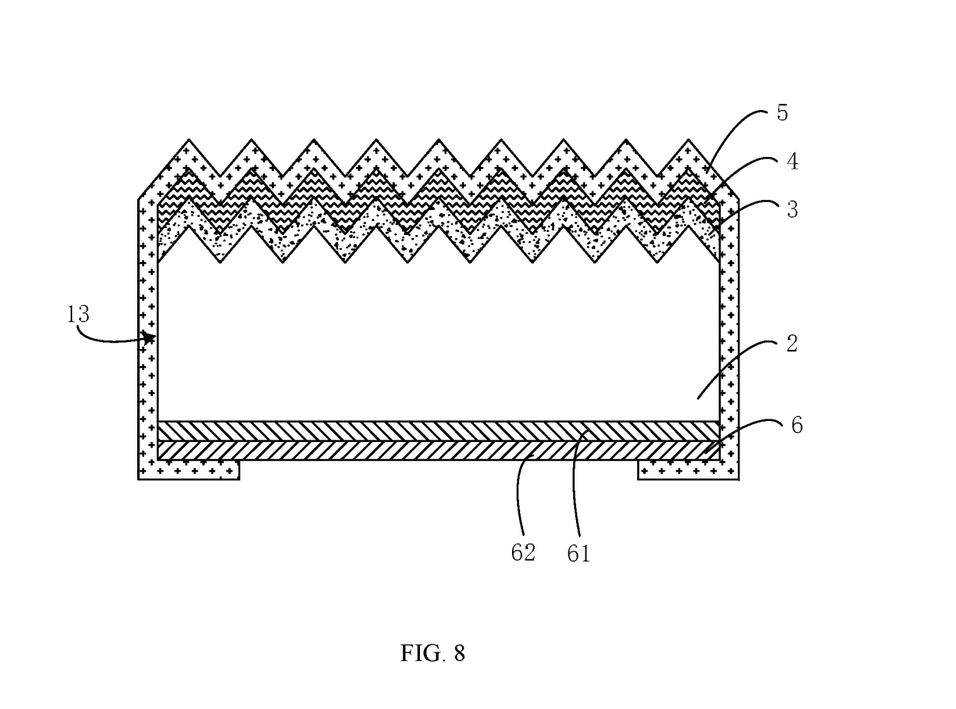
FIG. 8 is a schematic view showing an anti-reflection layer formed by a method for manufacturing a solar cell according to an embodiment of the present application.

Further, referring also to FIGS. 6, 7, and 8, in step S2, the step of forming the anti-reflection layer 5 on the first passivation layer 4 includes:
  on a condition that the passivation contact layer 6 of the panel 10 faces the positioning boat 8, clamping the panel 10 between the positioning protrusions 9 disposed on the positioning boat 8, and depositing an anti-reflection material on a first unblocked surface area of the panel 10; and
  adjusting a position of the positioning protrusions 9 relative to the side surfaces 13 of the substrate 2 to form a second unblocked surface area of the panel 10, and depositing the anti-reflection material on the second unblocked surface area of the panel 10, thereby forming the anti-reflection layer 5 on the first passivation layer 4, wherein the anti-reflection layer 5 at least covers the first passivation layer 4, the side surfaces 13, and the surfaces of the passivation contact layer 6 on the same side as the side surfaces 13.

Referring to FIG. 6, the position of the positioning protrusions 9 relative to the side surfaces 13 of the substrate 2 is adjusted by moving the positioning protrusions 9 relative to the side surfaces 13 of the substrate 2, so that the positioning protrusions 9 leave the original positions, and the part of the panel 10 originally blocked by the positioning protrusions 9 can be exposed to form the second unblocked surface area for the production of the anti-reflection layer 5. For example, on the basis of positional relationship shown in FIG. 6, the positioning protrusions 9 located on the left and right sides of the panel 10 (on the left and right sides of FIG. 6) can be moved up or down, and the positioning protrusion 9 located under the panel 10 (on the bottom side of FIG. 6) can be moved left or right. The position adjustment can be done once or multiple times.

The panel 10 can be completely attached to the positioning boat 8, or can have a distance from the positioning boat 8. Specifically, on the condition that the passivation contact layer 6 of the panel 10 is in contact with the positioning boat 8, the edges of the formed anti-reflection layer 5 adjacent to the second surface 12 of the substrate 2 are formed to be flush with the surface of the passivation contact layer 6 away from the substrate 2. That is, the anti-reflection layer 5 will not be formed on the passivation contact layer 6 (as blocked by the positioning boat 8).

On the condition that a distance is formed between the passivation contact layer 6 of the panel 10 and the positioning boat 8, the anti-reflection layer 5 is formed to also cover at least part of the passivation contact layer 6 adjacent to the side surfaces 13. The peripheral area of the passivation contact layer 6 is exposed to the reaction gas, so that the anti-reflection layer 5 is also formed on the peripheral area of the passivation contact layer 6, as shown in FIG. 2. Of course, in this case, in the subsequent step of forming the second passivation layer 7, the second passivation layer 7 also covers the part of the anti-reflection layer 5 on the second surface 12.

Figure 9:
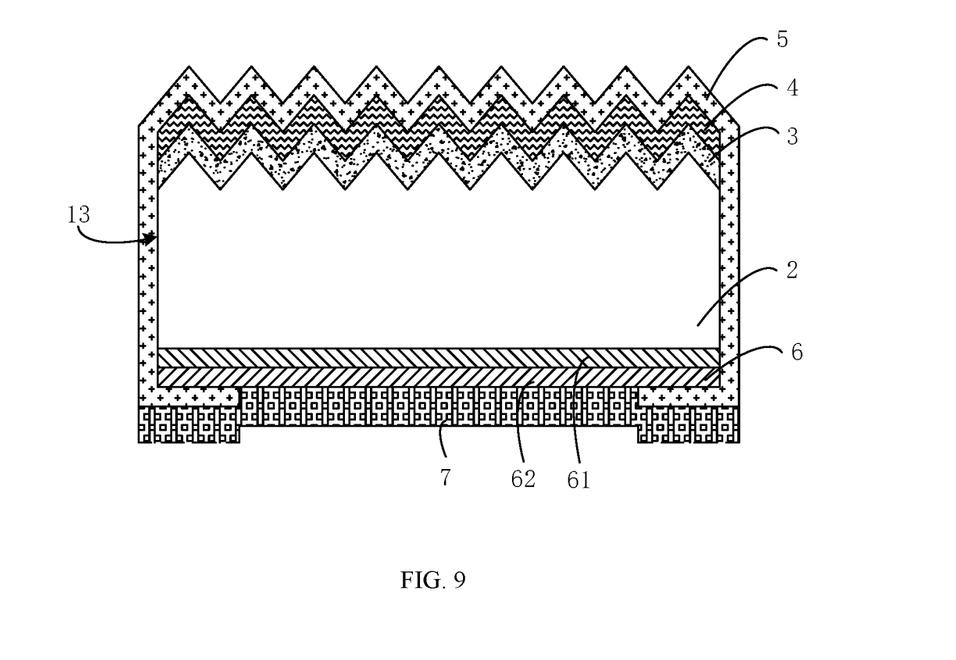
FIG. 9 is a schematic view showing a second passivation layer formed by a method for manufacturing a solar cell according to an embodiment of the present application.

After the step of forming the passivation contact layer 6, the method further includes the step of forming the second passivation layer 7 on the passivation contact layer 6, such as forming the structure shown in FIG. 9.

A specific example is given below to illustrate an embodiment of the method for manufacturing the solar cell, the method including steps A to D:

In step A, the substrate 2 is sequentially subjected to texturing, boron element doping, and alkali polishing to texture the first surface 11 and form a doped conducting layer 3 on the textured first surface 11 of the substrate 2.

In step B, a tunneling material layer and an amorphous silicon material layer are formed on the substrate 2, doped with phosphorus and etched to form a passivation contact layer 6 on the second surface 12 of the substrate 2, and an aluminum oxide layer is deposited on the doped conducting layer 3 to form the first passivation layer 4, thereby forming the panel 10 shown in FIG. 7.

In step C, on the condition that the passivation contact layer 6 of the panel 10 faces the positioning boat 8 and has a distance from the positioning boat 8, the panel 10 is placed and clamped between the positioning protrusions 9 on the positioning boat 8, and the anti-reflection material is deposited on unblocked surface areas of the panel 10.

Then the positions of the positioning protrusions 9 relative to the side surfaces 13 of substrate 2 are adjusted, and the anti-reflection material is continued to be deposited on unblocked surface areas of the panel 10, thereby forming the anti-reflection layer 5 on the first passivation layer 4, wherein the anti-reflection layer 5 covers the first passivation layer 4, each side surface 13, the surfaces of the passivation contact layer 6 on the same side as the side surfaces 13, and a part of the surface of the passivation contact layer 6 adjacent to the side surfaces 13 of the substrate 2, as shown in FIG. 8.

In step D, the second passivation layer 7 is formed on the passivation contact layer 6, as shown in FIG. 9, and electrodes are formed on the anti-reflection layer 5 and the second passivation layer 7, electrically conducted and tested for sorting.

Figure 10:
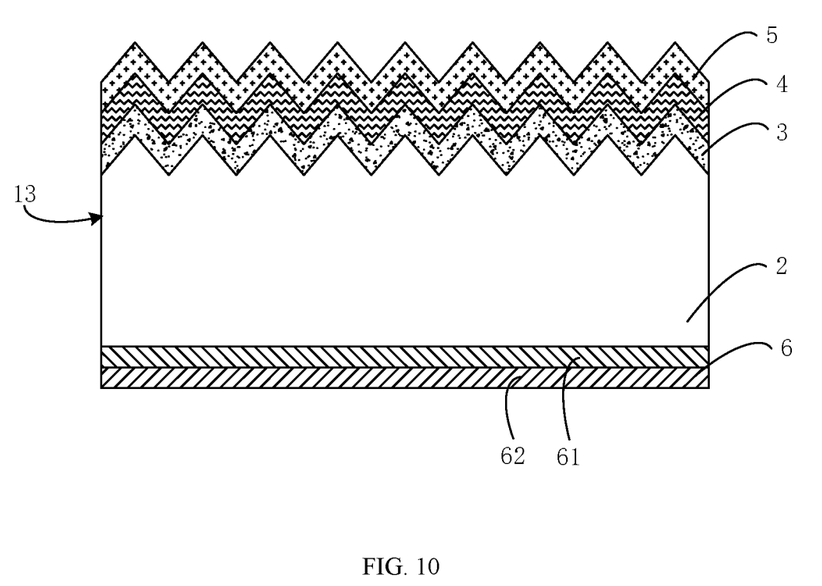
FIG. 10 is a schematic view showing an anti-reflection layer formed by a method for manufacturing a solar cell according to another embodiment of the present application.

In some other embodiments, referring to FIGS. 3, 4, 10, and 11, on each side, in the direction normal to the side surface 13 of the substrate 2, the side surface 13 of the substrate 2 is flush with the edges of the doped conducting layer 3, the first passivation layer 4, the anti-reflection layer 5 on the same side as the side surface 13 of the substrate 2. In these embodiments where the formed anti-reflection layer 5 only covers the first surface 11, the step of forming the second passivation layer 7 on the passivation contact layer 6 includes:

On the condition that the anti-reflection layer 5 faces the positioning boat 8, a first structure is clamped between the positioning protrusions 9 provided on the positioning boat 8, and a second passivation material is deposited on the first unblocked surface area of the first structure, wherein the first structure includes the panel 10 and the anti-reflection layer 5 formed on the panel 10.

Figure 11:
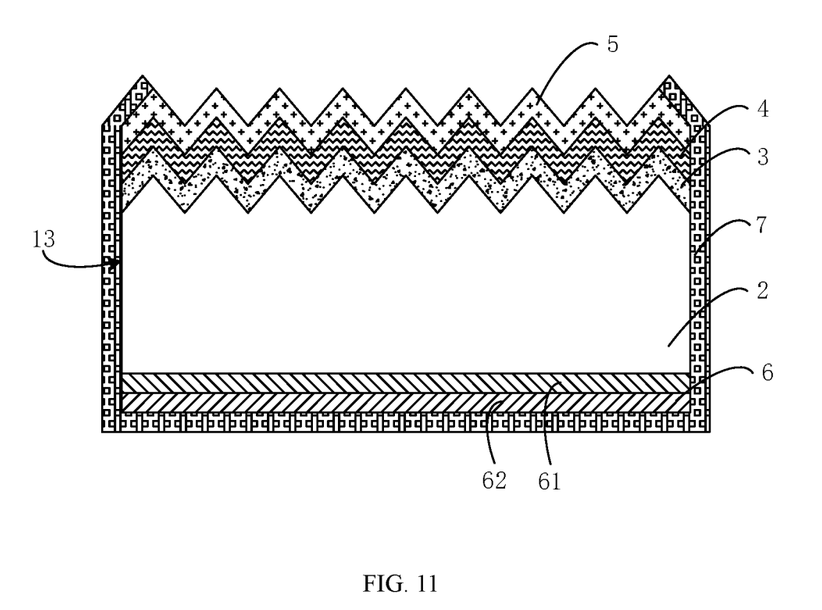
FIG. 11 is a schematic view showing a second passivation layer formed by a method for manufacturing a solar cell according to another embodiment of the present application.

After that, the position of each positioning protrusion 9 relative to the side surfaces 13 of substrate 2 is adjusted to form a second unblocked surface area of the first structure, and the second passivation material is continued to be deposited on the second unblocked surface area of the first structure, thereby forming the second passivation layer 7 on the passivation contact layer 6, wherein the second passivation layer 7 at least completely covers each side surface 13 of the substrate 2, and at least completely covers the edges of the doped conducting layer 3, first passivation layer 4, and anti-reflection layer 5 on the same side as each side surface 13.

During this process, referring to FIG. 6, the positions of the positioning protrusions 9 are adjusted by moving the positioning protrusions 9 relative to the side surfaces 13 of the substrate 2, so that the positioning protrusions 9 leave the original positions, and the part originally blocked by the positioning protrusions 9 can be exposed to form the second unblocked surface area for the production of the second passivation layer 7. For example, on the basis of positional relationship shown in FIG. 6, the positioning protrusions 9 located on the left and right sides of the panel 10 (on the left and right sides of FIG. 6) can be moved up or down, and the positioning protrusion 9 located under the panel 10 (on the bottom side of FIG. 6) can be moved left or right. The position adjustment can be done once or multiple times.

The panel 10 can be completely attached to the positioning boat 8, or can have a distance from the positioning boat 8. Specifically, on the condition that the anti-reflection layer 5 is in contact with the positioning boat 8, the edges of the formed second passivation layer 7 adjacent to the first surface 11 of the substrate 2 are formed to be flush with the outer surface of the anti-reflection layer 5 along the thickness direction of the substrate 2, for example, forming the structure as shown in FIG. 3.

On the condition that a distance is formed between the anti-reflection layer 5 and the positioning boat 8, the second passivation layer 7 is formed to further cover at least part of the first surface 11 adjacent to each side surface 13, for example, forming the structure as shown in FIG. 4.

A specific example is given below to illustrate another embodiment of the method for manufacturing the solar cell, the method including steps E to I:

In step E, the substrate 2 is sequentially subjected to texturing, boron element doping, and alkali polishing to texture the first surface 11 and form a doped conducting layer 3 on the first surface 11 of the substrate 2.

In step F, a tunneling material layer and an amorphous silicon material layer are formed on the substrate 2, doped with phosphorus, and etched to form a passivation contact layer 6 on the second surface 12 of the substrate 2, and an aluminum oxide layer is deposited on the doped conducting layer 3 to form the first passivation layer 4, thereby forming the panel 10 shown in FIG. 7.

In step G, the anti-reflection layer 5 is formed on the first passivation layer 4, and on each side, in the direction normal to the side surface 13 of the substrate 2, the side surface 13 of the substrate 2 is flush with the edges of the doped conducting layer 3, the first passivation layer 4, the anti-reflection layer 5 on the same side as the side surface 13 of the substrate 2, as shown in FIG. 10.

In step H, on the condition that the anti-reflection layer 5 faces the positioning boat 8 and has a distance from the positioning boat 8, the first structure is placed and clamped between the positioning protrusions 9 on the positioning boat 8, and the second passivation material is deposited on unblocked surface areas of the first structure, wherein the first structure includes the panel 10 and the anti-reflection layer 5 formed on the panel 10.

Then the positions of the positioning protrusions 9 relative to the side surfaces 13 of the substrate 2 are adjusted, and the second passivation material is continued to be deposited on the unblocked surface areas of the first structure, thereby forming the second passivation layer 7 on the passivation contact layer 6. The second passivation layer 7 completely covers each side surface 13 of the substrate 2, and completely covers the edges of the doped conducting layer 3, the first passivation layer 4, and the anti-reflection layer 5 on the same side as the side surface 13 of the substrate 2, and covers the peripheral area of the anti-reflection layer 5 which is adjacent to the side surface 13 of the substrate 2, as shown in FIG. 11.

In step I, electrodes are formed on the anti-reflection layer 5 and the second passivation layer 7, electrically conducted and tested for sorting.

In specific embodiments, referring to FIG. 6, the distance between the panel 10 and the positioning boat 8 can be adjusted, for example, by adjusting the positions of the positioning protrusions 9 at both sides of the panel 10 in the height direction H of the positioning boat 8. For example, by moving the positioning protrusions 9 downward along the height direction H of the positioning boat 8, e.g., the arrow direction in FIG. 6, the distance between the panel 10 and the positioning boat 8 can be increased, and conversely, the distance can be reduced.

An embodiment of the present application provides a photovoltaic device, which includes at least one cell group, wherein the cell group includes at least two above-described solar cells 1, and the solar cells 1 can be connected together by serial welding.

Exemplarily, the photovoltaic device further includes an encapsulation layer and a cover plate. The encapsulation layer is configured to cover the surface of the cell group, and the cover plate is configured to cover the surface of the encapsulation layer away from the cell group. The solar cells 1 are electrically connected in the form of a whole piece or multiple pieces to form multiple cell groups, and the multiple cell groups are electrically connected in series and/or in parallel. The encapsulation layer can be an organic encapsulation film, such as an ethylene-vinyl acetate copolymer film, a polyethylene-octene elastomer film or a polyethylene terephthalate film. The cover plate can be with a light-transmitting function, such as a glass cover plate or a plastic cover plate.

An embodiment of the present application also provides a photovoltaic system, which includes the above-described photovoltaic device. The structure, function, and working principle of photovoltaic device and the solar cells have been described in detail above, and will not be repeated here.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A solar cell, comprising:
a substrate including opposing first and second surfaces and a plurality of side surfaces adjacent to and between the first and second surfaces;
a doped conducting layer and a first passivation layer sequentially stacked on and only covering the first surface;
an anti-reflection layer stacked on the first passivation layer, the anti-reflection layer covering the first surface to at least cover the first passivation layer;
a passivation contact layer stacked on and only entirely covering the second surface, the passivation contact layer including a tunnel oxide layer and a doped polysilicon conductive layer sequentially stacked on and only entirely covering the second surface; and
a second passivation layer stacked on the passivation contact layer, the second passivation layer covering the second surface to at least cover the passivation contact layer;
wherein the anti-reflection layer further covers at least part of the plurality of side surfaces, and the anti-reflection layer further covers at least part of the second surface, the at least part of the second surface being adjacent to the at least part of the plurality of side surfaces; a part of the anti-reflection layer is stacked on the passivation contact layer; the second passivation layer covers at least part of the anti-reflection layer on the second surface, a part of the second passivation layer is stacked on the anti-reflection layer, the part of the anti-reflection layer is sandwiched between the passivation contact layer and the second passivation layer, and the part of the anti-reflection layer is directly in contact with a surface of the passivation contact layer away from the second surface.

2. A photovoltaic device, comprising at least one cell group, wherein the cell group includes at least two solar cells according to claim 1.

3. A photovoltaic system, comprising the photovoltaic device according to claim 2.

4. A solar cell, comprising:
a substrate including opposing first and second surfaces and a plurality of side surfaces adjacent to and between the first and second surfaces;
a doped conducting layer and a first passivation layer sequentially stacked on the first surface;
an anti-reflection layer stacked on the first passivation layer, the anti-reflection layer covering the first surface to at least cover the first passivation layer;
a passivation contact layer stacked on the second surface, the passivation contact layer including a tunnel oxide layer and a doped polysilicon conductive layer sequentially stacked on the second surface; and
a second passivation layer stacked on the passivation contact layer, the second passivation layer covering the second surface to at least cover the passivation contact layer;
wherein the anti-reflection layer further covers at least part of the plurality of side surfaces, and the anti-reflection layer further covers at least part of the second surface, the at least part of the second surface being adjacent to the at least part of the plurality of side surfaces; a part of the anti-reflection layer is sandwiched between the passivation contact layer and the second passivation layer on the second surface, and the part of the anti-reflection layer is directly in contact with a surface of the passivation contact layer away from the second surface.

5. The solar cell according to claim 4, wherein the passivation contact layer only entirely covers the second surface, the tunnel oxide layer and the doped polysilicon conductive layer only and entirely covers the second surface.

6. The solar cell according to claim 4, wherein only a part of the second surface is covered with the anti-reflection layer.

7. The solar cell according to claim 4, wherein the second passivation layer further covers at least part of the plurality of side surfaces and covers an edge of the doped conducting layer.

8. The solar cell according to claim 7, wherein the second passivation layer further covers at least part of the first surface, the at least part of the first surface being adjacent to the at least part of the plurality of side surfaces.

9. The solar cell according to claim 4, wherein a thickness from the passivation contact layer to the second passivation layer in a stacked area is greater than a thickness from the passivation contact layer to the second passivation layer in a center of the solar cell, and the stacked area is a range of the second surface covered with the anti-reflection layer.

10. A solar cell, comprising:
a substrate including opposing first and second surfaces and a plurality of side surfaces adjacent to and between the first and second surfaces;
a doped conducting layer and a first passivation layer sequentially stacked on the first surface;
an anti-reflection layer stacked on the first passivation layer, the anti-reflection layer covering the first surface to at least cover the first passivation layer;
a passivation contact layer stacked on the second surface, the passivation contact layer including a tunnel oxide layer and a doped polysilicon conductive layer sequentially stacked on the second surface; and
a second passivation layer stacked on the passivation contact layer, the second passivation layer covering the second surface to at least cover the passivation contact layer;
wherein the anti-reflection layer further covers at least part of the plurality of side surfaces, and the anti-reflection layer further covers at least part of the second surface, the at least part of the second surface being adjacent to the at least part of the plurality of side surfaces; a part of the anti-reflection layer is stacked on the passivation contact layer; the second passivation layer covers at least part of the anti-reflection layer on the second surface, a part of the second passivation layer is stacked on the anti-reflection layer; and a thickness from the second surface to a surface of the second passivation layer away from the substrate in a stacked area is greater than a thickness from the second surface to the surface of the second passivation layer away from the substrate in a center of the solar cell, and the stacked area is an area of the second surface covered with the anti-reflection layer, and a difference between the thickness in the stacked area and the thickness in the center of the solar cell is equal to a thickness of the anti-reflection layer on the second surface.

* * * * *